(12) United States Patent
Kato (10) Patent No.: US 9,160,307 B2
(45) Date of Patent: Oct. 13, 2015

(54) DUPLEXER MODULE

(71) Applicant: Murata Manufacturing Co., Ltd., Nagaokakyo-shi, Kyoto-fu (JP)

(72) Inventor: Masanori Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 105 days.

(21) Appl. No.: 13/956,506

(22) Filed: Aug. 1, 2013

(65) Prior Publication Data

US 2013/0314174 A1    Nov. 28, 2013

Related U.S. Application Data

(63) Continuation of application No. PCT/JP2012/051437, filed on Jan. 24, 2012.

(30) Foreign Application Priority Data

Feb. 4, 2011    (JP) .................................. 2011-022827

(51) Int. Cl.
| | | |
|---|---|---|
| *H03H 9/46* | (2006.01) | |
| *H03H 9/74* | (2006.01) | |
| *H03H 9/05* | (2006.01) | |

(Continued)

(52) U.S. Cl.
CPC ............... *H03H 9/74* (2013.01); *H03H 9/0009* (2013.01); *H03H 9/0057* (2013.01); *H03H 9/0542* (2013.01); *H03H 9/0571* (2013.01); *H03H 9/0576* (2013.01); *H03H 9/605* (2013.01); *H03H 9/6483* (2013.01); *H03H 9/706* (2013.01); *H03H 9/725* (2013.01); *H04B 1/52* (2013.01); *H05K 1/0245* (2013.01); *H05K 1/0216* (2013.01); *H05K 1/0243* (2013.01)

(58) Field of Classification Search
CPC ........... H03H 9/15; H03H 9/25; H03H 9/954; H03H 9/64
USPC .......................................... 333/133, 193–196
See application file for complete search history.

(56) References Cited

U.S. PATENT DOCUMENTS 8,040,205 B2 * 10/2011 Hatano et al. ................. 333/133
8,072,292 B2 * 12/2011 Kihara .......................... 333/132

(Continued)

FOREIGN PATENT DOCUMENTS

JP    2002-208875 A    7/2002
JP    2003-092526 A    3/2003

(Continued)

OTHER PUBLICATIONS

Official Communication issued in International Patent Application No. PCT/JP2012/051437, mailed on Mar. 19, 2012.

(Continued)

*Primary Examiner* — Dean Takaoka
(74) *Attorney, Agent, or Firm* — Keating & Bennett, LLP (57) ABSTRACT

At least one duplexer includes first and second balanced terminals. A mount electrode layer includes a first balanced mount electrode, which is connected to the first balanced terminal, and a second balanced mount electrode, which is connected to the second balanced terminal. An internal electrode layer includes at least one internal ground electrode. When viewing a mount board from a side on which the duplexer is mounted, the first and second balanced mount electrodes do not oppose the same internal ground electrode.

20 Claims, 10 Drawing Sheets

(51) Int. Cl.
*H03H 9/60* (2006.01)
*H03H 9/64* (2006.01)
*H03H 9/70* (2006.01)
*H03H 9/72* (2006.01)
*H04B 1/52* (2015.01)
*H03H 9/00* (2006.01)
*H03H 7/42* (2006.01)
*H05K 1/02* (2006.01)

(56) References Cited

U.S. PATENT DOCUMENTS

| | | | |
|---|---|---|---|
| 8,390,396 B2* | 3/2013 | Furutani | 333/132 |
| 8,847,700 B2* | 9/2014 | Hara et al. | 333/133 |
| 8,872,602 B2* | 10/2014 | Kato | 333/133 |
| 2002/0140526 A1 | 10/2002 | Nakamura et al. | |
| 2007/0229189 A1 | 10/2007 | Iwata | |
| 2008/0284540 A1 | 11/2008 | Nishihara et al. | |
| 2011/0221542 A1 | 9/2011 | Kihara | |
| 2013/0176916 A1* | 7/2013 | Uejima | 370/278 |
| 2013/0307638 A1* | 11/2013 | Kato | 333/133 |
| 2013/0307749 A1* | 11/2013 | Nagai | 343/853 |
| 2013/0314174 A1* | 11/2013 | Kato | 333/133 |
| 2013/0329611 A1* | 12/2013 | Kitajima | 370/278 |

FOREIGN PATENT DOCUMENTS

| | | |
|---|---|---|
| JP | 2007-274471 A | 10/2007 |
| JP | 2008-271230 A | 11/2008 |
| JP | 2009-225198 A | 10/2009 |
| JP | 2010-045563 A | 2/2010 |
| JP | 4539788 B2 | 9/2010 |
| WO | 2010/067497 A1 | 6/2010 |

OTHER PUBLICATIONS

Official Communication issued in corresponding German Patent Application No. 11 2012 000 679.8, mailed on Apr. 28, 2014.

* cited by examiner

DUPLEXER MODULE

BACKGROUND OF THE INVENTION

1. Field of the Invention

The present invention relates to a duplexer module.

2. Description of the Related Art

These days, in communication services provided by, for example, cellular phones, certain measures for an increased number of subscribers are being taken, global roaming enabling the worldwide use of communication services is being developed, the communication quality is being improved, and various contents are becoming larger. In order to deal with such communication services, it is necessary that communication devices, such as cellular phones, support multiple bands and multiple systems. Accordingly, in a communication device which supports multiple bands or multiple systems, a plurality of interstage filters or wave splitters are mounted on an RF (Radio Frequency) circuit. That is, interstage filters or wave splitters corresponding to individual bands or individual communication systems are mounted on a communication device.

While the number of interstage filters or wave splitters mounted on an RF circuit is increasing, it is still desirable to reduce the size of a communication device. Accordingly, in order to reduce the size of an RF circuit, a study is being made to mount, on an RF circuit, a filter module constituted by interstage filters, wave splitters, and a plurality of matching devices corresponding to individual bands or individual communication systems. In Japanese Unexamined Patent Application Publication No. 2010-45563, a duplexer module, which is one type of filter module, is disclosed.

Figure 17:
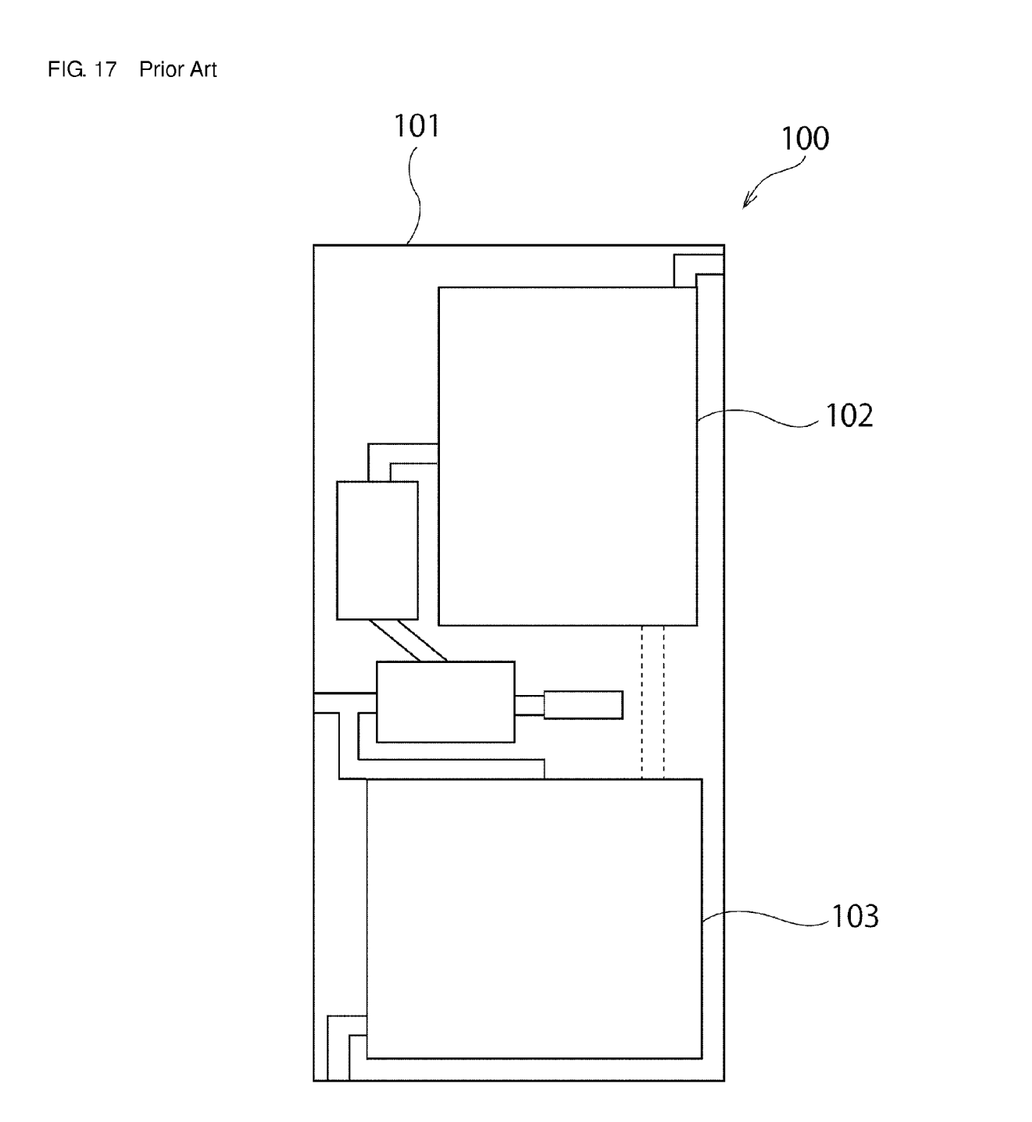
FIG. 17 is a schematic plan view of a duplexer module disclosed in Japanese Unexamined Patent Application Publication No. 2010-45563.

FIG. 17 is a schematic plan view of a duplexer module 100 disclosed in Japanese Unexamined Patent Application Publication No. 2010-45563. The duplexer module 100 includes a mount board 101 and first and second duplexers 102 and 103. The first and second duplexers 102 and 103 are mounted on the front surface of the mount board 101. The first and second duplexers 102 and 103 each include an antenna terminal, a transmission terminal, and reception terminals. The mount board 101 includes first and second antenna terminal electrodes, first and second transmission terminal electrodes, and first and second reception terminal electrodes. The first and second antenna terminal electrodes, the first and second transmission terminal electrodes, and the first and second reception terminal electrodes are formed on the back surface of the mount board 101.

The antenna terminal of the first duplexer 102 is connected to the first antenna terminal electrode of the mount board 101. The transmission terminal of the first duplexer 102 is connected to the first transmission terminal electrode of the mount board 101. The reception terminals of the first duplexer 102 are connected to the first reception terminal electrodes of the mount board 101. The antenna terminal of the second duplexer 103 is connected to the second antenna terminal electrode of the mount board 101. The transmission terminal of the second duplexer 103 is connected to the second transmission terminal electrode of the mount board 101. The reception terminals of the second duplexer 103 are connected to the second reception terminal electrodes of the mount board 101.

In order to support a case in which an RFIC of an RF circuit is a balanced input type, a reception filter of the first duplexer 102 is constituted by a longitudinally coupled resonator-type surface acoustic wave filter having a balanced-unbalanced transforming function. That is, the duplexer module 100 is a balanced duplexer module. Accordingly, the reception terminals of the first duplexer 102 are constituted by a pair of terminals, which are first and second balanced terminals. The first reception terminal electrodes of the mount board 101 are also constituted by a pair of terminal electrodes, which are first and second balanced terminal electrodes. Accordingly, a balanced signal is output from the first reception terminal electrodes of the mount board 101.

In the duplexer module 100 configured as described above, differential isolation characteristics in a transmission band may become deteriorated.

SUMMARY OF THE INVENTION

In view of the above description, preferred embodiments of the present invention provide a duplexer module exhibiting excellent differential isolation characteristics in a transmission band.

A duplexer module according to a preferred embodiment of the present invention includes a mount board and at least one duplexer. The mount board includes a mount electrode layer, an internal electrode layer, a terminal electrode layer, and at least one dielectric layer. The mount board includes the mount electrode layer, the internal electrode layer, the terminal electrode layer, and the dielectric layer stacked on each other such that the mount electrode layer is located on the topmost side and the terminal electrode layer is located on the bottommost side and such that the mount electrode layer and the internal electrode layer oppose each other with at least one dielectric layer therebetween. At least one duplexer is mounted on a front surface of the mount board and includes first and second balanced terminals. The mount electrode layer includes a first balanced mount electrode, which is connected to the first balanced terminal, and a second balanced mount electrode, which is connected to the second balanced terminal. The internal electrode layer includes at least one internal ground electrode. When viewing the mount board from a side on which the duplexer is mounted, the first and second balanced mount electrodes do not oppose the same internal ground electrode.

In one specific aspect of the duplexer module according to a preferred embodiment of the present invention, when viewing the mount board from the side on which the duplexer is mounted, at least one of the first and second balanced mount electrodes may not oppose the internal ground electrode.

In another specific aspect of the duplexer module according to a preferred embodiment of the present invention, when viewing the mount board from the side on which the duplexer is mounted, one of the first and second balanced mount electrodes may not oppose the internal ground electrode, and the other one of the second and first balanced mount electrodes may oppose the internal ground electrode.

In a different specific aspect of the duplexer module according to a preferred embodiment of the present invention, when viewing the mount board from the side on which the duplexer is mounted, neither of the first balanced mount electrode nor the second balanced mount electrode may oppose the internal ground electrode.

In still another specific aspect of the duplexer module according to a preferred embodiment of the present invention, when viewing the mount board from the side on which the duplexer is mounted, the first balanced mount electrode and the second balanced mount electrode may oppose different internal ground electrodes.

In still another different specific aspect of the duplexer module according to a preferred embodiment of the present invention, the duplexer may be a surface acoustic wave filter, a boundary acoustic wave filter, or a bulk acoustic wave filter.

In a yet another specific aspect of the duplexer module according to a preferred embodiment of the present invention, the duplexer may include a filter portion having a balanced-unbalanced transforming function.

According to various preferred embodiments of the present invention, it is possible to provide a duplexer module exhibiting excellent differential isolation characteristics in a transmission band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below through illustration of a duplexer module 1. However, the duplexer module 1 is illustrated as only an example. A duplexer module according to the present invention is not whatsoever restricted to the duplexer module 1. A duplexer module according to the present invention is not particularly restricted as long as it includes a duplexer including first and second balanced terminals.

First Preferred Embodiment

Figure 1:
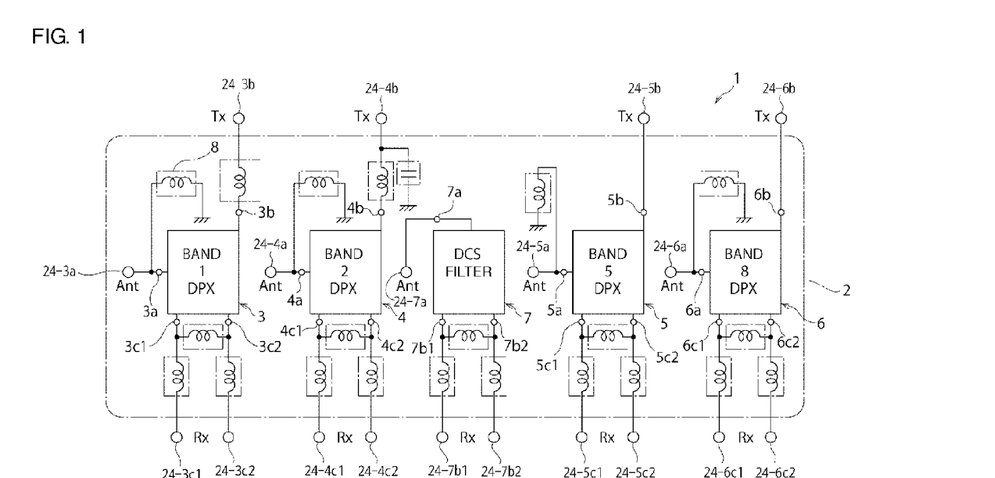
FIG. 1 is a schematic circuit diagram of a duplexer module of a first preferred embodiment of the present invention.
Figure 2:
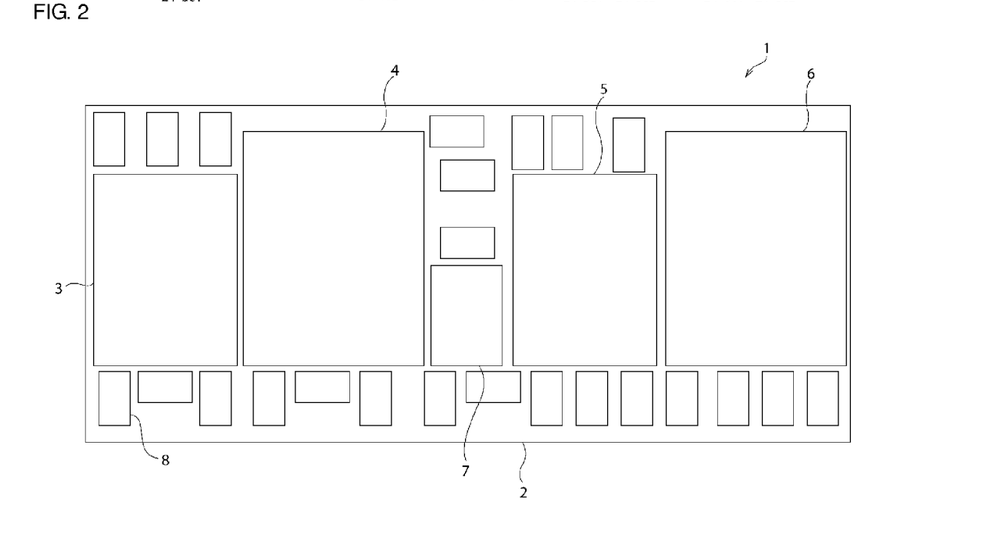
FIG. 2 is a schematic plan view of the duplexer module of the first preferred embodiment of the present invention.

The duplexer module 1 of this preferred embodiment preferably is mounted on an RF circuit of a communication device, such as a cellular phone corresponding to a CDMA system, such as UMTS. FIG. 1 is a schematic circuit diagram of the duplexer module 1 of this preferred embodiment. FIG. 2 is a schematic plan view of the duplexer module 1 of this preferred embodiment.

As shown in FIGS. 1 and 2, the duplexer module 1 includes a mount board 2, duplexers 3, 4, 5, and 6, a reception filter 7, and a plurality of chip components 8. The chip components 8 are matching devices, such as inductors and capacitors. As shown in FIG. 2, the duplexers 3, 4, 5, and 6, the reception filter 7, and the chip components 8 are mounted on the front surface of the mount board 2 by using, for example, solder.

The duplexer 3 is a duplexer corresponding to UMTS-BAND1. The transmission frequency band of UMTS-BAND1 is 1920 MHz to 1980 MHz, and the reception frequency band thereof is 2110 MHz to 2170 MHz.

Figure 3:
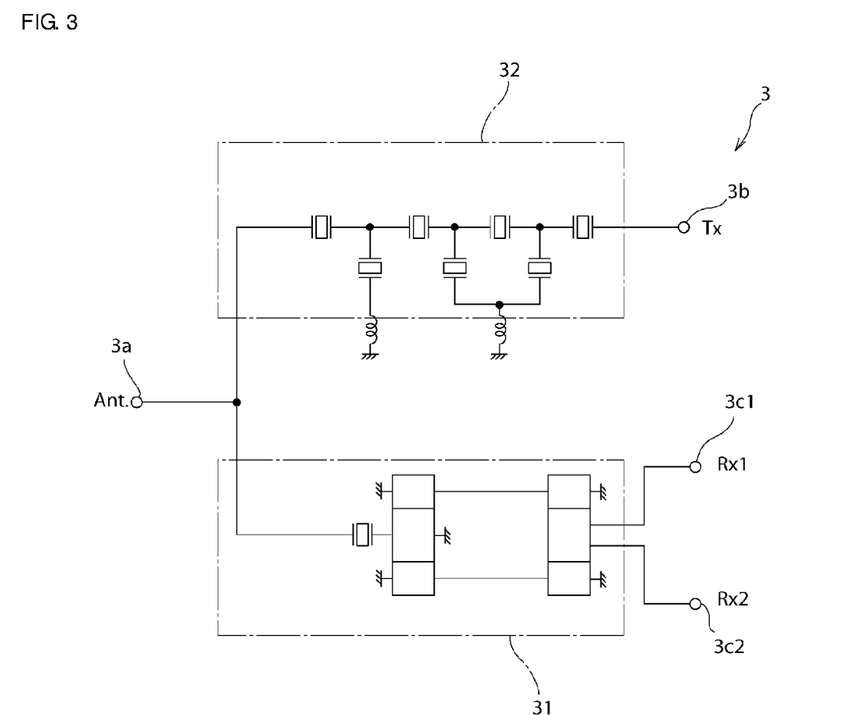
FIG. 3 is a schematic circuit diagram of a duplexer in the duplexer module of the first preferred embodiment of the present invention.
Figure 4:
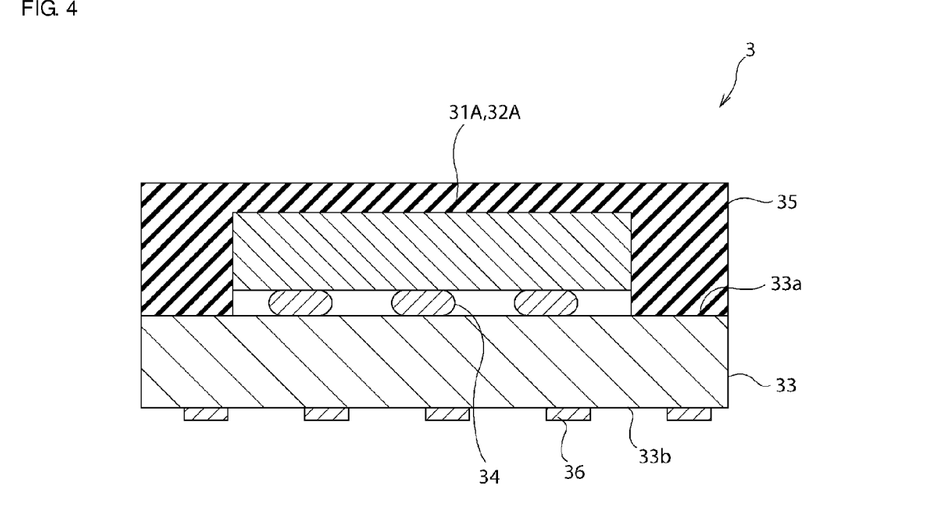
FIG. 4 is a schematic sectional view of the duplexer in the duplexer module of the first preferred embodiment of the present invention.

FIG. 3 is a schematic circuit diagram of the duplexer 3 in the duplexer module 1 of this preferred embodiment. FIG. 4 is a schematic sectional view of the duplexer 3 in the duplexer module 1 of this preferred embodiment.

As shown in FIG. 3, the duplexer 3 includes a reception filter 31 and a transmission filter 32. The reception filter 31 preferably is a longitudinally coupled resonator-type surface acoustic wave filter having a balanced-unbalanced transforming function. That is, the duplexer 3 includes a filter portion having a balanced-unbalanced transforming function.

The transmission filter 32 preferably is a ladder surface acoustic wave filter. The duplexer 3 includes an antenna terminal 3a, a transmission terminal 3b, and reception terminals 3c1 and 3c2. An input terminal of the reception filter 31 and an output terminal of the transmission filter 32 are connected to the antenna terminal 3a. An input terminal of the transmission filter 32 is connected to the transmission terminal 3b. Output terminals of the reception filter 31 are connected to the reception terminals 3c1 and 3c2. The reception terminal 3c1 is a first balanced terminal, and the reception terminal 3c2 is a second balanced terminal.

As shown in FIG. 4, the duplexer 3 includes a wiring board 33, a reception-side surface acoustic wave filter chip 31A, and a transmission-side surface acoustic wave filter chip 32A. The reception-side surface acoustic wave filter chip 31A and the transmission-side surface acoustic wave filter chip 32A are flip-chip-mounted on a die attach surface 33a of the wiring board 33 via bumps 34. A sealing resin 35 is provided on the wiring board 33 so as to cover the reception-side surface acoustic wave filter chip 31A and the transmission-side surface acoustic wave filter chip 32A. That is, the duplexer 3 preferably is a CSP (Chip Size Package) surface acoustic wave device. The wiring board 33 is a resin-made printed wiring multilayered board or a ceramic multilayered board. In the duplexer 3, the reception filter 31 is provided in the reception-side surface acoustic wave filter chip 31A, and the transmission filter 32 is provided in the transmission-side surface acoustic wave filter chip 32A. In the duplexer 3, back surface terminals 36 are provided on a back surface 33b of the wiring board 33.

Figure 5:
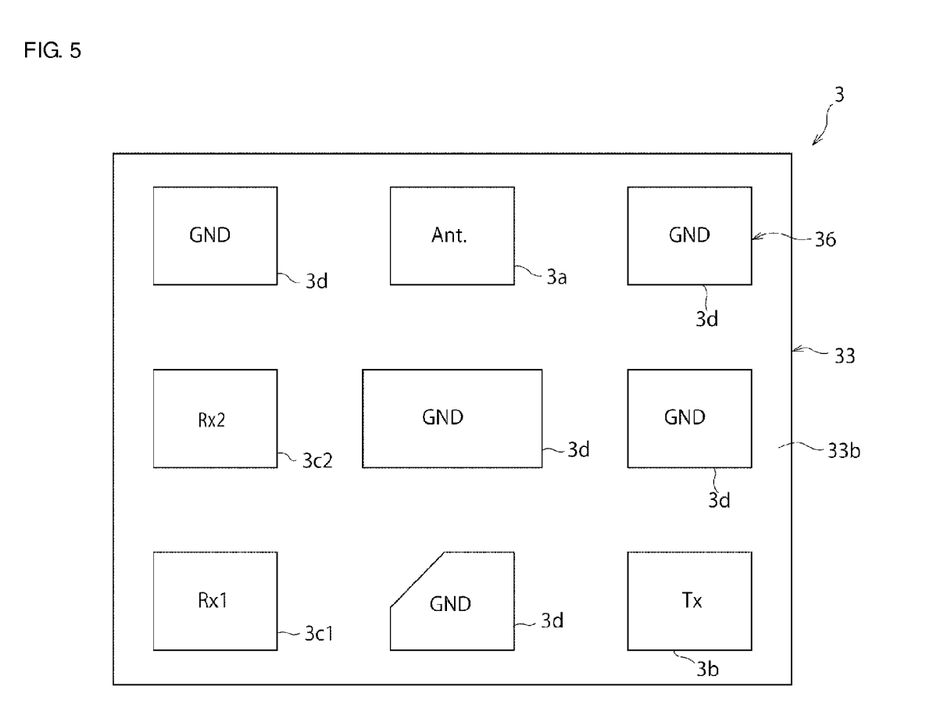
FIG. 5 is a perspective plan view of back surface terminals of the duplexer in the duplexer module of the first preferred embodiment of the present invention.

FIG. 5 is a perspective plan view of the back surface terminals 36 of the duplexer 3 in the duplexer module 1 of this preferred embodiment. FIG. 5 shows a state in which the wiring board 33 is seen through from the side on which the reception-side surface acoustic wave filter chip 31A and the transmission-side surface acoustic wave filter chip 32A are mounted. Examples of the back surface terminals 36 are the antenna terminal 3a, the transmission terminal 3b, the reception terminals 3c1 and 3c2, and ground terminals 3d. The ground terminals 3d are used to connect the reception filter 31 and the transmission filter 32 to a ground.

The duplexer 4 preferably is a duplexer corresponding to UMTS-BAND2. The transmission frequency band of UMTS-BAND2 is 1850 MHz to 1910 MHz, and the reception frequency band thereof is 1930 MHz to 1990 MHz. The duplexer 4 is configured similarly to the duplexer 3. That is, the duplexer 4 includes a reception filter and a transmission filter. The reception filter preferably is a longitudinally coupled resonator-type surface acoustic wave filter having a balanced-unbalanced transforming function. That is, the duplexer 4 includes a filter portion having a balanced-unbalanced transforming function. The duplexer 4 includes an antenna terminal 4a, a transmission terminal 4b, and reception terminals 4c1 and 4c2. The duplexer 4 also includes ground terminals to connect the reception filter and the transmission filter to a ground, though such ground terminals are not shown.

The duplexer 5 is a duplexer corresponding to UMTS-BAND5. The transmission frequency band of UMTS-BAND5 is 824 MHz to 849 MHz, and the reception frequency band thereof is 869 MHz to 894 MHz. The duplexer 5 is configured similarly to the duplexer 3. That is, the duplexer 5 includes a reception filter and a transmission filter. The reception filter preferably is a longitudinally coupled resonator-type surface acoustic wave filter having a balanced-unbalanced transforming function. That is, the duplexer 5 includes a filter portion having a balanced-unbalanced transforming function. The duplexer 5 includes an antenna terminal 5a, a transmission terminal 5b, and reception terminals 5c1 and 5c2. The duplexer 5 also includes ground terminals to connect the reception filter and the transmission filter to a ground, though such ground terminals are not shown.

The duplexer 6 is a duplexer corresponding to UMTS-BAND8. The transmission frequency band of UMTS-BAND8 is 880 MHz to 915 MHz, and the reception frequency band thereof is 925 MHz to 960 MHz. The duplexer 6 is configured similarly to the duplexer 3. That is, the duplexer 6 includes a reception filter and a transmission filter. The reception filter preferably is a longitudinally coupled resonator-type surface acoustic wave filter having a balanced-unbalanced transforming function. That is, the duplexer 6 includes a filter portion having a balanced-unbalanced transforming function. The duplexer 6 includes an antenna terminal 6a, a transmission terminal 6b, and reception terminals 6c1 and 6c2. The duplexer 6 also includes ground terminals to connect the reception filter and the transmission filter to a ground, though such ground terminals are not shown.

The reception filter 7 is a reception-side interstage filter corresponding to DCS. The reception frequency band of DCS is 1805 MHz to 1880 MHz. The reception filter 7 preferably is a longitudinally coupled resonator-type surface acoustic wave filter having a balanced-unbalanced transforming function. That is, the reception filter 7 includes a filter portion having a balanced-unbalanced transforming function. The reception filter 7 includes an input terminal 7a and output terminals 7b1 and 7b2. The reception filter 7 also includes ground terminals, though such ground terminals are not shown. As well as the duplexer 3, the reception filter 7 preferably is a CSP surface acoustic wave device.

Figure 6:
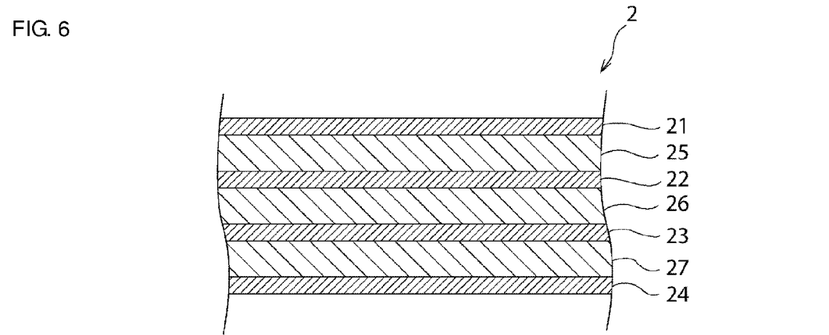
FIG. 6 is a simplified sectional view illustrating portion of a mount board in the duplexer module of the first preferred embodiment of the present invention.

FIG. 6 is a simplified sectional view illustrating a portion of the mount board 2 in the duplexer module 1 of this preferred embodiment. As shown in FIG. 6, the mount board 2 includes first through fourth electrode layers 21 through 24 and first through third dielectric layers 25 through 27. In the mount board 2, these electrode layers and dielectric layers are alternately stacked. More specifically, from the top, the first electrode layer 21, the first dielectric layer 25, the second electrode layer 22, the second dielectric layer 26, the third electrode layer 23, the third dielectric layer 27, and the fourth electrode layer 24 are sequentially stacked on each other. That is, among the first through fourth electrode layers 21 through 24 and the first through third dielectric layers 25 through 27, the first electrode layer 21 is located on the topmost side, and the fourth electrode layer 24 is located on the bottommost side.

The mount board 2 is a printed wiring multilayer board. The first through fourth electrode layers 21 through 24 are made of a metal, such as Cu. The first through third dielectric layers 25 through 27 are made of, for example, a resin.

Figure 7:
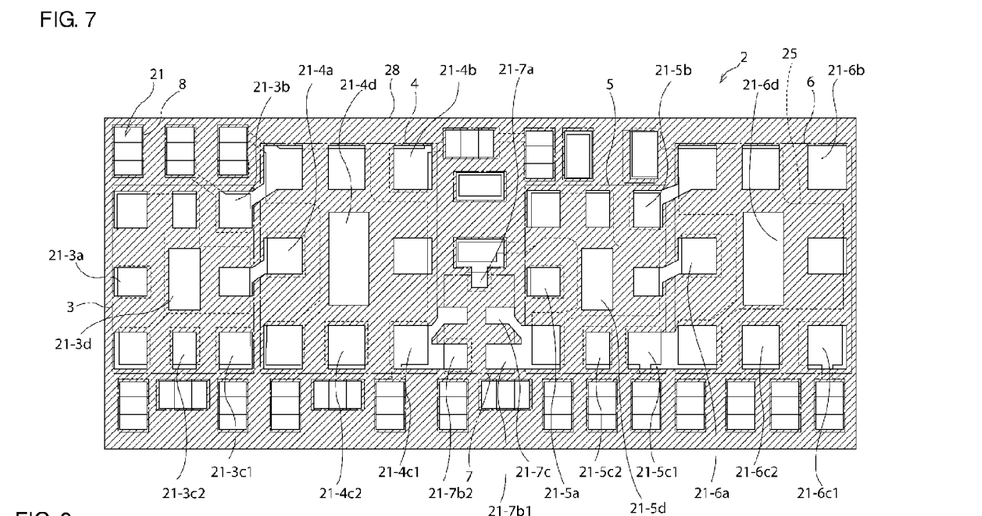
FIG. 7 is a perspective plan view schematically illustrating the mount board in the duplexer module of the first preferred embodiment of the present invention.
Figure 8:
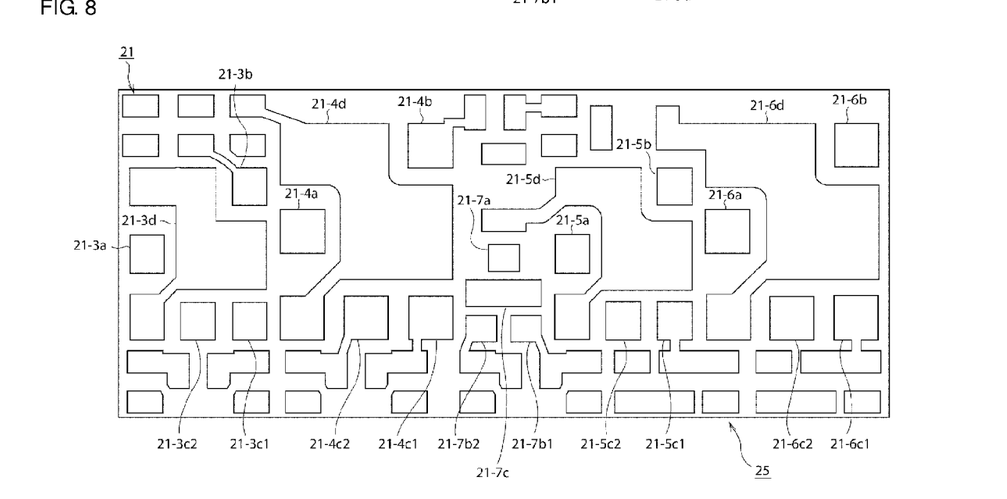
FIG. 8 is a perspective plan view schematically illustrating a first electrode layer and a first dielectric layer of the mount board in the duplexer module of the first preferred embodiment of the present invention.
Figure 9:
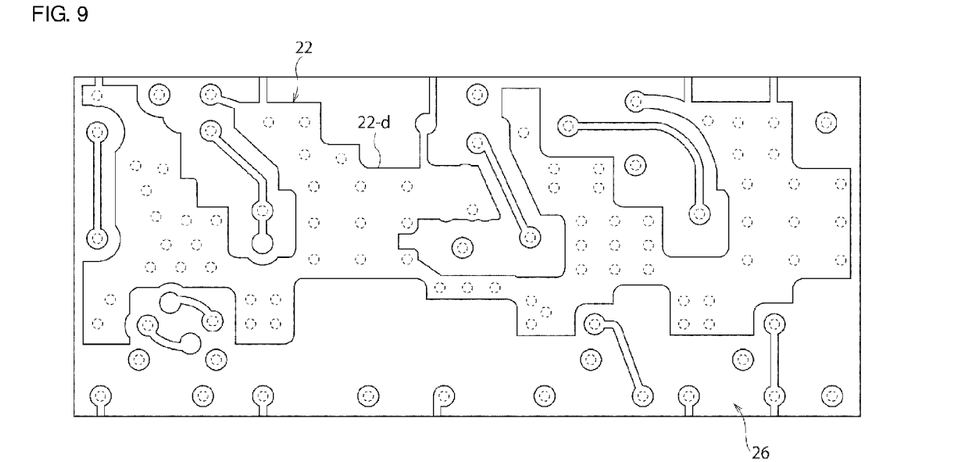
FIG. 9 is a perspective plan view schematically illustrating a second electrode layer and a second dielectric layer of the mount board in the duplexer module of the first preferred embodiment of the present invention.
Figure 10:
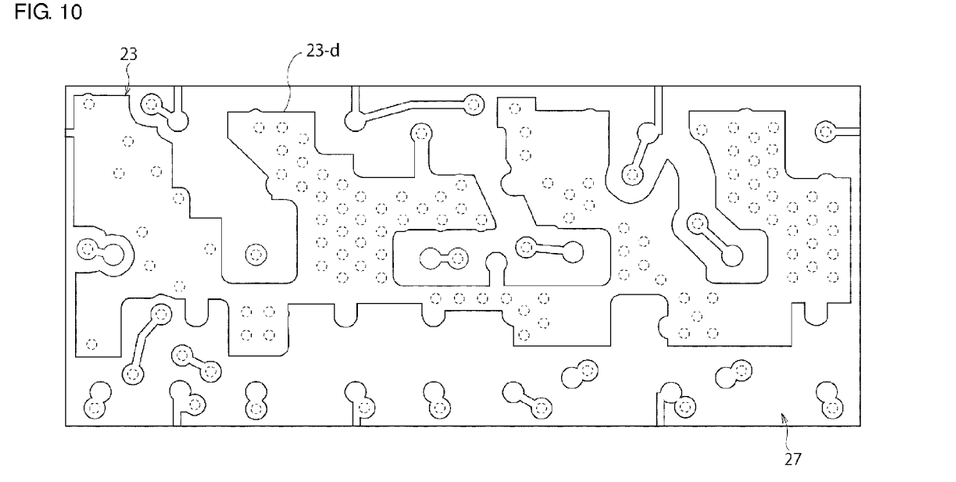
FIG. 10 is a perspective plan view schematically illustrating a third electrode layer and a third dielectric layer of the mount board in the duplexer module of the first preferred embodiment of the present invention.
Figure 11:
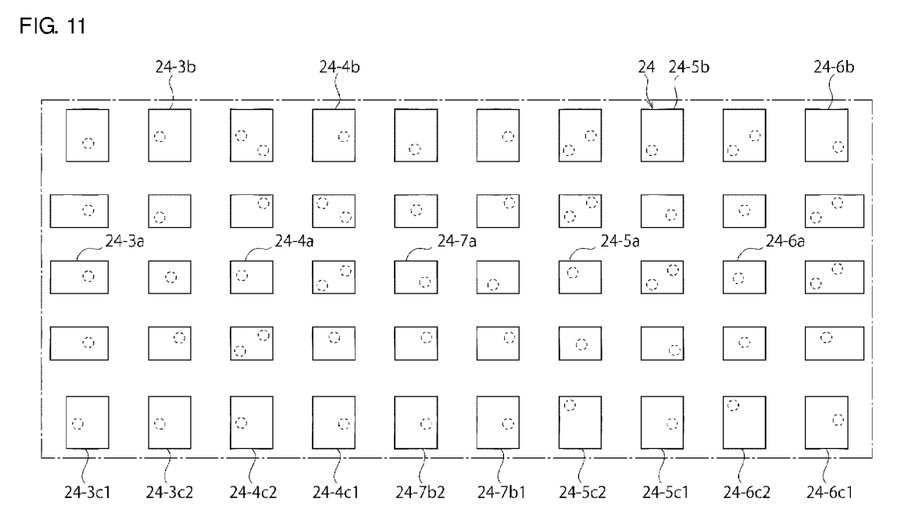
FIG. 11 is a perspective plan view schematically illustrating a fourth electrode layer of the mount board in the duplexer module of the first preferred embodiment of the present invention.

FIG. 7 is a perspective plan view schematically illustrating the mount board 2 in the duplexer module 1 of this preferred embodiment. FIG. 8 is a perspective plan view schematically illustrating the first electrode layer 21 and the first dielectric layer 25 of the mount board 2 in the duplexer module 1 of this preferred embodiment. FIG. 9 is a perspective plan view schematically illustrating the second electrode layer 22 and the second dielectric layer 26 of the mount board 2 in the duplexer module 1 of this preferred embodiment. FIG. 10 is a perspective plan view schematically illustrating the third electrode layer 23 and the third dielectric layer 27 of the mount board 2 in the duplexer module 1 of this preferred embodiment. FIG. 11 is a perspective plan view schematically illustrating the fourth electrode layer 24 of the mount board 2 in the duplexer module 1 of this preferred embodiment. FIGS. 7 through 11 show a state in which the mount board 2 is seen through from the side on which the duplexers 3, 4, 5, and 6, the reception filter 7, and the chip components 8 are mounted.

As shown in FIG. 7, on the mount board 2, a resist layer 28 is arranged so as to cover a portion of the first electrode layer 21. In FIG. 7, regions in which the duplexers 3, 4, 5, and 6, the reception filter 7, and the chip components 8 are disposed are indicated by the long dashed dotted lines.

As shown in FIG. 8, the first electrode layer 21 is a mount electrode layer including a plurality of mount electrodes. As shown in FIG. 9, the second electrode layer 22 is an internal electrode layer including a plurality of internal electrodes. As shown in FIG. 10, the third electrode layer 23 is an internal electrode layer including a plurality of internal electrodes. The third electrode layer 23, which is an internal electrode layer, opposes the first electrode layer 21, which is a mount electrode layer, with the first dielectric layer 25, the second electrode layer 22, and the second dielectric layer 26, therebetween. As shown in FIG. 11, the fourth electrode layer 24 is a terminal electrode layer including a plurality of terminal electrodes.

In FIGS. 9 through 11, via-hole electrodes are indicated by circles. Via-hole electrodes connect between the mount electrodes of the first electrode layer 21 and the internal electrodes of the second electrode layer 22, between the internal electrodes of the second electrode layer 22 and the internal electrodes of the third electrode layer 23, and between the internal electrodes of the third electrode layer 23 and the terminal electrodes of the fourth electrode layer 24.

As shown in FIGS. 7 and 8, the first electrode layer 21 includes mount electrodes 21-3a, 21-3b, 21-3c1, 21-3c2, 21-3d, 21-4a, 21-4b, 21-4c1, 21-4c2, 21-4d, 21-5a, 21-5b, 21-5c1, 21-5c2, 21-5d, 21-6a, 21-6b, 21-6c1, 21-6c2, 21-6d, 21-7a, 21-7b1, 21-7b2, and 21-7c.

The mount electrode 21-3a is connected to the antenna terminal 3a of the duplexer 3. The mount electrode 21-3b is connected to the transmission terminal 3b of the duplexer 3. The mount electrode 21-3c1 is connected to the reception terminal 3c1 of the duplexer 3. The mount electrode 21-3c2 is connected to the reception terminal 3c2 of the duplexer 3. The mount electrode 21-3d is connected to the ground terminals 3d of the duplexer 3. The mount electrode 21-3c1 is a first balanced mount electrode, which is connected to the reception terminal 3c1 of the duplexer 3, which is the first balanced terminal. The mount electrode 21-3c2 is a second balanced mount electrode, which is connected to the reception terminal 3c2 of the duplexer 3, which is the second balanced terminal.

The mount electrode 21-4a is connected to the antenna terminal 4a of the duplexer 4. The mount electrode 21-4b is connected to the transmission terminal 4b of the duplexer 4. The mount electrode 21-4c1 is connected to the reception terminal 4c1 of the duplexer 4. The mount electrode 21-4c2 is connected to the reception terminal 4c2 of the duplexer 4. The mount electrode 21-4d is connected to ground terminals of the duplexer 4, which are not shown.

The mount electrode 21-5a is connected to the antenna terminal 5a of the duplexer 5. The mount electrode 21-5b is connected to the transmission terminal 5b of the duplexer 5. The mount electrode 21-5c1 is connected to the reception terminal 5c1 of the duplexer 5. The mount electrode 21-5c2 is connected to the reception terminal 5c2 of the duplexer 5. The mount electrode 21-5d is connected to ground terminals of the duplexer 5, which are not shown.

The mount electrode 21-6a is connected to the antenna terminal 6a of the duplexer 6. The mount electrode 21-6b is connected to the transmission terminal 6b of the duplexer 6. The mount electrode 21-6c1 is connected to the reception terminal 6c1 of the duplexer 6. The mount electrode 21-6c2 is connected to the reception terminal 6c2 of the duplexer 6. The mount electrode 21-6d is connected to ground terminals of the duplexer 6, which are not shown.

The mount electrode 21-7a is connected to the input terminal 7a of the reception filter 7. The mount electrode 21-7b1 is connected to the output terminal 7b1 of the reception filter 7. The mount electrode 21-7b2 is connected to the output terminal 7b2 of the reception filter 7. The mount electrode 21-7c is connected to ground terminals of the reception filter 7, which are not shown.

The other mount electrodes of the first electrode layer are connected to the terminal electrodes of the chip components 8.

As shown in FIG. 9, the second electrode layer 22 includes an internal electrode 22-d. The internal electrode 22-d is connected to the mount electrodes 21-3d, 21-4d, 21-5d, 21-6d, and 21-7c of the first electrode layer 21 by via-hole electrodes. The internal electrode 22-d is a ground electrode, which is connected to a ground.

As shown in FIG. 10, the third electrode layer 23 includes an internal electrode 23-d. The internal electrode 23-d is connected to the internal electrode 22-d of the second electrode layer 22 by via-hole electrodes. The internal electrode 23-d is a ground electrode, which is connected to a ground, and is a first internal ground electrode.

As shown in FIG. 11, the fourth electrode layer 24 includes terminal electrodes 24-3a, 24-3b, 24-3c1, 24-3c2, 24-4a, 24-4b, 24-4c1, 24-4c2, 24-5a, 24-5b, 24-5c1, 24-5c2, 24-6a, 24-6b, 24-6c1, 24-6c2, 24-7a, 24-7b1, and 24-7b2.

The terminal electrode 24-3a is connected to the mount electrode 21-3a of the first electrode layer 21 with the internal electrodes of the second electrode layer 22 and the internal electrodes of the third electrode layer 23 therebetween. That is, the terminal electrode 24-3a is connected to the antenna terminal 3a of the duplexer 3. The terminal electrode 24-3a is also an antenna terminal electrode, which is connected to an antenna of a communication device.

The terminal electrode 24-3b is connected to the mount electrode 21-3b of the first electrode layer 21 with the internal electrodes of the second electrode layer 22 and the internal electrodes of the third electrode layer 23 therebetween. That is, the terminal electrode 24-3b is connected to the transmission terminal 3b of the duplexer 3. The terminal electrode 24-3b is also a transmission terminal electrode, which is connected to an RFIC of a communication device.

The terminal electrode 24-3c1 is connected to the mount electrode 21-3c1 of the first electrode layer 21 with the internal electrodes of the second electrode layer 22 and the internal electrodes of the third electrode layer 23 therebetween. That is, the terminal electrode 24-3c1 is connected to the reception terminal 3c1 of the duplexer 3. The terminal electrode 24-3c1 is a first balanced terminal electrode, which is connected to the mount electrode 21-3c1, which is the first balanced mount electrode. The terminal electrode 24-3c1 is also a first reception terminal electrode, which is connected to an RFIC of a communication device.

The terminal electrode 24-3c2 is connected to the mount electrode 21-3c2 of the first electrode layer 21 with the internal electrodes of the second electrode layer 22 and the internal electrodes of the third electrode layer 23 therebetween. That is, the terminal electrode 24-3c2 is connected to the reception terminal 3c2 of the duplexer 3. The terminal electrode 24-3c2 is a second balanced terminal electrode, which is connected to the mount electrode 21-3c2, which is the second balanced mount electrode. The terminal electrode 24-3c2 is also a second reception terminal electrode, which is connected to an RFIC of a communication device.

The terminal electrode 24-4a is connected to the mount electrode 21-4a of the first electrode layer 21 with the internal electrodes of the second electrode layer 22 and the internal electrodes of the third electrode layer 23 therebetween. The terminal electrode 24-4b is connected to the mount electrode 21-4b of the first electrode layer 21 with the internal electrodes of the second electrode layer 22 and the internal electrodes of the third electrode layer 23 therebetween. The terminal electrode 24-4c1 is connected to the mount electrode 21-4c1 of the first electrode layer 21 with the internal electrodes of the second electrode layer 22 and the internal electrodes of the third electrode layer 23 therebetween. The terminal electrode 24-4c2 is connected to the mount electrode 21-4c2 of the first electrode layer 21 with the internal electrodes of the second electrode layer 22 and the internal electrodes of the third electrode layer 23 therebetween.

The terminal electrode 24-5a is connected to the mount electrode 21-5a of the first electrode layer 21 with the internal electrodes of the second electrode layer 22 and the internal electrodes of the third electrode layer 23 therebetween. The terminal electrode 24-5b is connected to the mount electrode 21-5b of the first electrode layer 21 with the internal electrodes of the second electrode layer 22 and the internal electrodes of the third electrode layer 23 therebetween. The terminal electrode 24-5c1 is connected to the mount electrode 21-5c1 of the first electrode layer 21 with the internal electrodes of the second electrode layer 22 and the internal electrodes of the third electrode layer 23 therebetween. The terminal electrode 24-5c2 is connected to the mount electrode 21-5c2 of the first electrode layer 21 with the internal electrodes of the second electrode layer 22 and the internal electrodes of the third electrode layer 23 therebetween.

The terminal electrode 24-6a is connected to the mount electrode 21-6a of the first electrode layer 21 with the internal electrodes of the second electrode layer 22 and the internal electrodes of the third electrode layer 23 therebetween. The terminal electrode 24-6b is connected to the mount electrode 21-6b of the first electrode layer 21 with the internal electrodes of the second electrode layer 22 and the internal electrodes of the third electrode layer 23 therebetween. The terminal electrode 24-6c1 is connected to the mount electrode 21-6c1 of the first electrode layer 21 with the internal electrodes of the second electrode layer 22 and the internal electrodes of the third electrode layer 23 therebetween. The terminal electrode 24-6c2 is connected to the mount electrode 21-6c2 of the first electrode layer 21 with the internal electrodes of the second electrode layer 22 and the internal electrodes of the third electrode layer 23 therebetween.

The terminal electrode 24-7a is connected to the mount electrode 21-7a of the first electrode layer 21 with the internal electrodes of the second electrode layer 22 and the internal electrodes of the third electrode layer 23 therebetween. The terminal electrode 24-7b1 is connected to the mount electrode 21-7b1 of the first electrode layer 21 with the internal electrodes of the second electrode layer 22 and the internal electrodes of the third electrode layer 23 therebetween. The terminal electrode 24-7b2 is connected to the mount electrode 21-7b2 of the first electrode layer 21 with the internal electrodes of the second electrode layer 22 and the internal electrodes of the third electrode layer 23 therebetween.

The other terminal electrodes of the fourth electrode layer 24 are connected to the internal electrode 23-d of the third electrode layer 23 by via-hole electrodes. The other terminals of the fourth electrode layer 24 are ground terminal electrodes, which are connected to a ground.

In the duplexer module 1 of this preferred embodiment, when viewing the mount board from the side on which the duplexer is mounted, the first and second balanced mount electrodes do not oppose the same internal ground electrode. Specifically, when viewing the mount board from the side on which the duplexer is mounted, at least one of the first and second balanced mount electrodes does not oppose any internal ground terminal. More specifically, when viewing the mount board from the side on which the duplexer is mounted, one of the first and second balanced mount electrodes does not oppose any internal ground terminal, and the other one of the second and first balanced mount electrodes opposes an internal ground terminal.

That is, in the duplexer module 1 of this preferred embodiment, when viewing the mount board 2 from the side on which the duplexer 3 is mounted, the mount electrode 21-3c1 of the first electrode layer 21 opposes the internal electrode 23-d of the third electrode layer 23, and the mount electrode 21-3c2 of the first electrode layer 21 opposes neither of the internal electrode 22-d of the second electrode layer 22 nor the internal electrode 23-d of the third electrode layer 23. More specifically, when viewing the mount board 2 from the side on which the duplexer 3 is mounted, the internal electrode 23-d is located under the mount electrode 21-3c1, and thus, the mount electrode 21-3c1 has a portion which opposes the internal electrode 23-d. In contrast, when viewing the mount board 2 from the side on which the duplexer 3 is mounted, neither of the internal electrode 22-d nor the internal electrode 23-d is located under the mount electrode 21-3c2, and thus, the mount electrode 21-3c2 does not have a portion which opposes the internal electrode 22-d or 23-d.

In other words, in the duplexer module 1 of this preferred embodiment, when viewing the mount board from the side on which the duplexer is mounted, there is a portion in which the first balanced mount electrode and an internal ground electrode overlap each other, but in contrast, there is no portion in which the second balanced mount electrode and an internal ground electrode overlap each other. That is, in the duplexer module 1 of this preferred embodiment, when viewing the mount board 2 from the side on which the duplexer 3 is mounted, there is a portion in which the mount electrode 21-3c of the first electrode layer 21 and the internal electrode 23-d of the third electrode layer 23 overlap each other, but in contrast, there is no portion in which the mount electrode 21-3c2 of the first electrode layer 21 and the internal electrode 22-d or 23-d overlap each other. More specifically, when viewing the mount board 2 from the side on which the duplexer 3 is mounted, the internal electrode 23-d is located under the mount electrode 21-3c1, and thus, there is a portion in which the mount electrode 21-3c1 and the internal electrode 23-d overlap each other. In contrast, when viewing the mount board 2 from the side on which the duplexer 3 is mounted, neither of the internal electrode 22-d nor the internal electrode 23-d is located under the mount electrode 21-3c2, and thus, there is no portion in which the mount electrode 21-3c2 and the internal electrode 22-d or 23-d overlap each other.

With this configuration, in the duplexer module 1 of this preferred embodiment, differential isolation characteristics in a transmission band can be improved.

A comparative example, which is to be compared with the duplexer module 1 of this preferred embodiment, was prepared. In a duplexer module of the comparative example, the internal electrode 23-d is located under both of the mount electrode 21-3c1 and the mount electrode 21-3c2. When viewing the mount board 2 from the side on which the duplexer 3 is mounted, both of the mount electrodes 21-3c1 and 21-3c2 oppose the same internal electrode 23-d. The configuration of the duplexer module of the comparative example is the same as that of the duplexer module 1 of this preferred embodiment, except for the shape of the internal electrode 23-d of the third electrode layer 23.

Electrical characteristics of the duplexer module 1 of this preferred embodiment and those of the duplexer module of the comparative example were measured.

Figure 12:
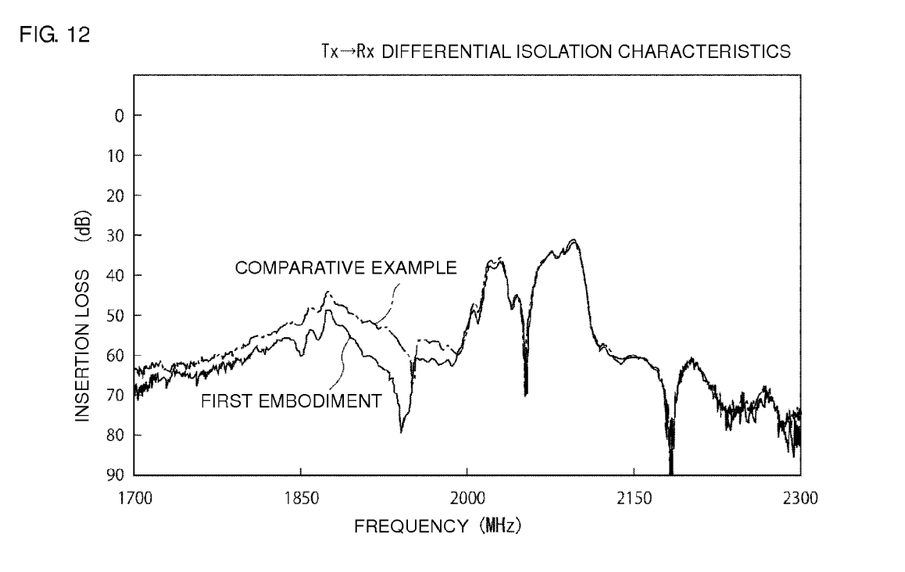
FIG. 12 illustrates differential isolation characteristics concerning differential isolation between a transmission terminal electrode and each of a first reception terminal electrode and a second reception terminal electrode of the duplexer module of the first preferred embodiment of the present invention, and those of a duplexer module of a comparative example.

FIG. 12 illustrates differential isolation characteristics concerning differential isolation between the terminal electrode 24-3b, which is the transmission terminal electrode, and the terminal electrode 24-3c1, which is the first reception terminal electrode, and between the terminal electrode 24-3b and the terminal electrode 24-3c2, which is the second reception terminal electrode, of the duplexer module 1 of this preferred embodiment, and those of the duplexer module of the comparative example. As shown in FIG. 12, in the duplexer module 1 of this preferred embodiment, a large attenuation occurs in a transmission frequency band (1920 MHz to 1980 MHz) of UMTS-BAND1 used in the duplexer 3, thereby exhibiting excellent differential isolation characteristics.

Figure 13:
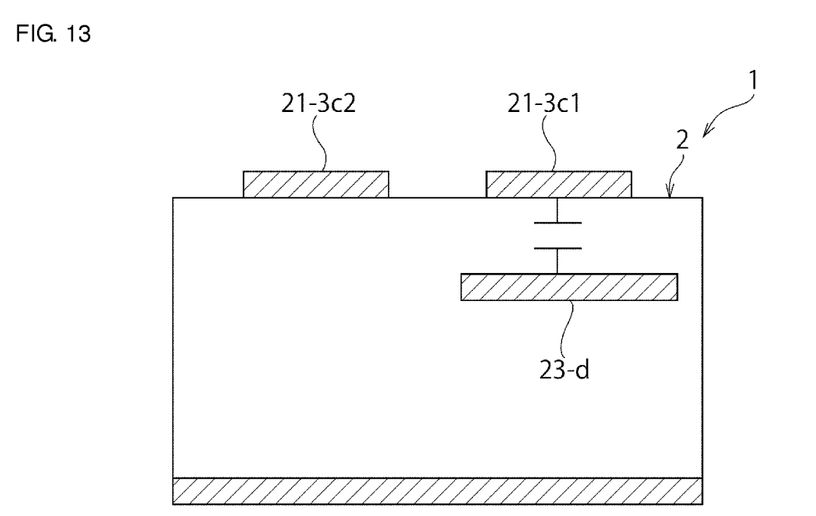
FIG. 13 is a partially enlarged sectional view schematically illustrating the duplexer module of the first preferred embodiment of the present invention.
Figure 14:
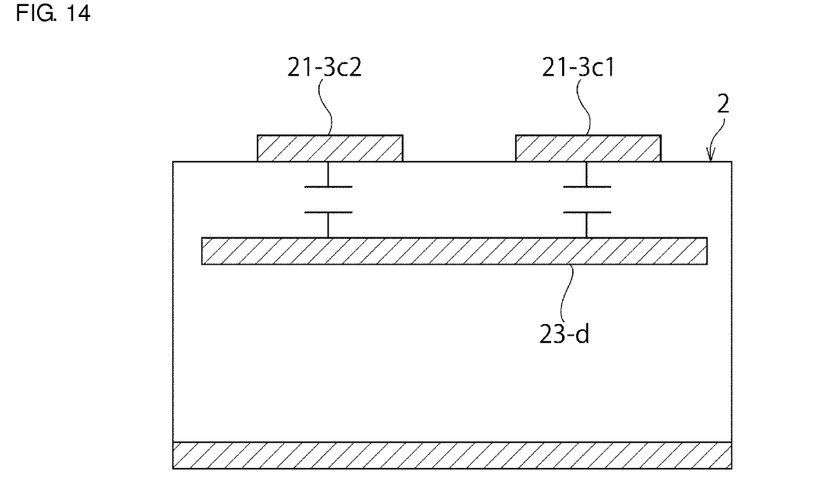
FIG. 14 is a partially enlarged sectional view schematically illustrating a duplexer module of a comparative example.

The principle that excellent differential isolation characteristics are obtained in the duplexer module 1 of this preferred embodiment will be discussed below. FIG. 13 is a partially enlarged sectional view schematically illustrating the duplexer module 1 of this preferred embodiment. FIG. 14 is a partially enlarged sectional view schematically illustrating the duplexer module of the comparative example.

As shown in FIG. 14, in the duplexer module of the comparative example, when viewing the mount board 2 from the side on which the duplexer 3 is mounted, both of the mount electrode 21-3c1 and the mount electrode 21-3c2 oppose the internal electrode 23-d. Accordingly, a capacitor is provided between the mount electrode 21-3c1 and the internal electrode 23-d and also between the mount electrode 21-3c2 and the internal electrode 23-d. Thus, the mount electrode 21-3c1 and the mount electrode 21-3c2 are strongly coupled to each other due to the presence of the capacitors and the internal electrode 23-d.

Accordingly, a portion of a signal flowing through the mount electrode 21-3c1 flows into the mount electrode 21-3c2 through the capacitors and the internal electrode 23-d, and then mixes with a signal flowing through the mount electrode 21-3c2. Similarly, a portion of a signal flowing through the mount electrode 21-3c2 flows into the mount electrode 21-3c1 through the capacitors and the internal electrode 23-d, and then mixes with a signal flowing through the mount electrode 21-3c1. As a result, differential isolation characteristics are deteriorated.

In contrast, as shown in FIG. 13, in the duplexer module 1 of this preferred embodiment, when viewing the mount board 2 from the side on which the duplexer 3 is mounted, the mount electrode 21-3c1 of the first electrode layer 21 opposes the internal electrode 23-d of the third electrode layer 23, and the mount electrode 21-3c2 of the first electrode layer 21 opposes neither of the internal electrode 22-d of the second electrode layer 22 nor the internal electrode 23-d of the third electrode layer 23. With this configuration, a capacitor is provided only between the mount electrode 21-3c1 and the internal electrode 23-d. Thus, the mount electrode 21-3c1 and the mount electrode 21-3c2 are not substantially coupled to each other.

Thus, a portion of a signal flowing through the mount electrode 21-3c1 does not substantially mix with a signal flowing through the mount electrode 21-3c2, and a portion of a signal flowing through the mount electrode 21-3c2 does not substantially mix with a signal flowing through the mount electrode 21-3c1. As a result, excellent differential isolation characteristics can be implemented.

Second Preferred Embodiment

Figure 15:
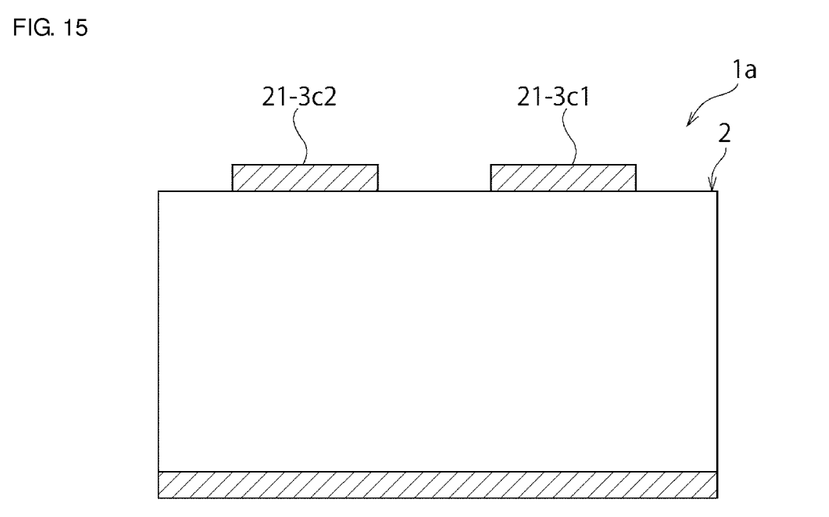
FIG. 15 is a partially enlarged sectional view schematically illustrating a duplexer module of a second preferred embodiment of the present invention.

FIG. 15 is a partially enlarged sectional view schematically illustrating a duplexer module 1a according to a second preferred embodiment of the present invention.

The configuration of the duplexer module 1a of this preferred embodiment is preferably the same or substantially the same as that of the duplexer module 1 of the first preferred embodiment, except that the shape of the internal electrode 23-d of the third electrode layer 23 is different from that of the duplexer module 1 of the first preferred embodiment.

As shown in FIG. 15, in the duplexer module 1a of this preferred embodiment, when viewing the mount board 2 from the side on which the duplexer 3 is mounted, the mount electrode 21-3c1 and the mount electrode 21-3c2 of the first electrode layer 21 oppose neither of the internal electrode 22-d of the second electrode layer 22 nor the internal electrode 23-d of the third electrode layer 23. With this configuration, the mount electrode 21-3c1 and the mount electrode 21-3c2 are not substantially coupled to each other. Thus, as in the duplexer module 1 of the first preferred embodiment, the duplexer module 1a of this preferred embodiment has excellent differential isolation characteristics.

Third Preferred Embodiment

Figure 16:
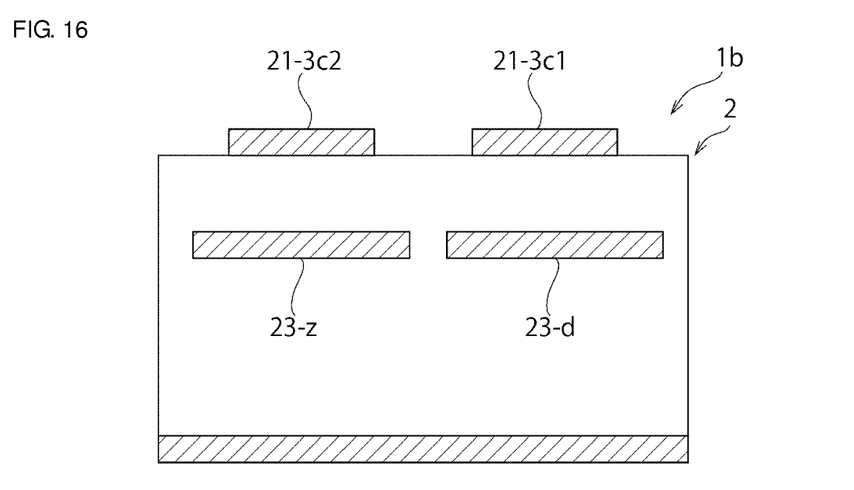
FIG. 16 is a partially enlarged sectional view schematically illustrating a duplexer module 1b of a third preferred embodiment of the present invention.

FIG. 16 is a partially enlarged sectional view schematically illustrating a duplexer module 1b according to a third preferred embodiment of the present invention.

The configuration of the duplexer module 1b of this preferred embodiment is preferably the same or substantially the same as that of the duplexer module 1 of the first preferred embodiment, except that the shape of the third electrode layer 23 is different from that of the duplexer module 1 of the first preferred embodiment.

As shown in FIG. 16, in the duplexer module 1b of this preferred embodiment, when viewing the mount board 2 from the side on which the duplexer 3 is mounted, the mount electrode 21-3c1 of the first electrode layer 21 opposes the internal electrode 23-d of the third electrode layer 23, and the mount electrode 21-3c2 of the first electrode layer 21 opposes an internal electrode 23-z of the third electrode layer 23. The internal electrode 23-z is a ground electrode, which is connected to a ground, and is a second internal ground electrode. The internal electrode 23-d and the internal electrode 23-z are not electrically connected to each other. With this configuration, the mount electrode 21-3c1 and the mount electrode 21-3c2 are not substantially coupled to each other. Thus, as in the duplexer module 1 of the first preferred embodiment, the duplexer module 1b of this preferred embodiment can implement excellent differential isolation characteristics.

Figure 18:
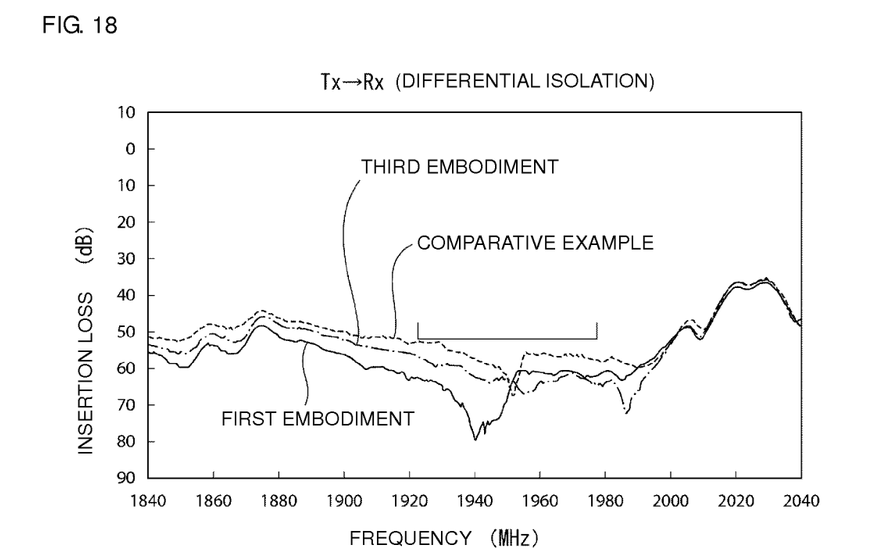
FIG. 18 is a graph illustrating differential isolation characteristics concerning differential isolation between a transmission terminal electrode and each of a first reception terminal electrode and a second reception terminal electrode of the duplexer module of the first preferred embodiment, those of the duplexer module of the third preferred embodiment, and those of the duplexer module of the comparative example.
Figure 19:
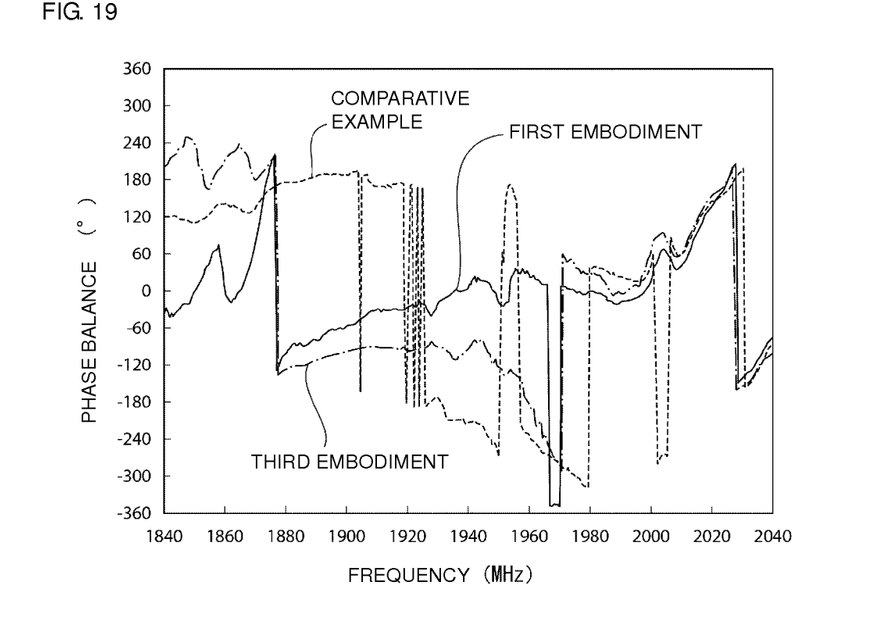
FIG. 19 is a graph illustrating phase balance characteristics of the duplexer module of the first preferred embodiment, those of the duplexer module of the third preferred embodiment, and those of the duplexer module of the comparative example.

FIG. 18 is a graph illustrating differential isolation characteristics concerning differential isolation between the transmission terminal electrode and each of the first reception terminal electrode and the second reception terminal electrode of the duplexer module of the first preferred embodiment, those of the duplexer module of the third preferred embodiment, and those of the duplexer module of the comparative example. FIG. 19 is a graph illustrating phase balance characteristics of the duplexer module of the first preferred embodiment, those of the duplexer module of the third preferred embodiment, and those of the duplexer module of the comparative example. Data of the comparative example shown in FIGS. 18 and 19 is the same as that of the comparative example shown in FIG. 12.

As shown in FIG. 18, in each of the duplexer module 1 of the first preferred embodiment and the duplexer module 1b of the third preferred embodiment, a large attenuation occurs in a transmission frequency band (1920 MHz to 1980 MHz) of UMTS-BAND1 used in the duplexer 3. This result indicates that excellent differential isolation characteristics can be obtained. Additionally, the result shown in FIG. 19 indicates that the duplexer module 1 of the first preferred embodiment and the duplexer module 1*b* of the third preferred embodiment have more excellent phase balance characteristics than the duplexer module of the comparative example.

In the duplexer module 1, the duplexers 3, 4, 5, and 6 and the reception filter 7 preferably include surface acoustic wave filters, for example. However, the present invention is not restricted to this type of filter. The duplexers may include any one of a surface acoustic wave filter, a boundary acoustic wave filter, and a bulk acoustic wave filter, for example.

Additionally, in the duplexer module 1, the reception filter of the duplexer 3 preferably includes a filter portion having a balanced-unbalanced transforming function. However, the present invention is not restricted to this type. Any type of balance-unbalanced function may be used as long as the duplexer includes first and second balanced terminals, for example, the duplexer may include a balun.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A duplexer module comprising:
a mount board that includes a mount electrode layer, an internal electrode layer, a terminal electrode layer, and at least one dielectric layer stacked on each other such that the mount electrode layer is located on a topmost side and the terminal electrode layer is located on a bottommost side and such that the mount electrode layer and the internal electrode layer oppose each other with the at least one dielectric layer therebetween; and
at least one duplexer that is mounted on a front surface of the mount board and that includes first and second balanced terminals; wherein
the mount electrode layer includes a first balanced mount electrode, which is connected to the first balanced terminal, and a second balanced mount electrode, which is connected to the second balanced terminal;
the internal electrode layer includes at least one internal ground electrode;
when viewing the mount board from the topmost side on which the duplexer is mounted in a stacking direction of the mount electrode layer, the internal electrode layer, the terminal electrode layer, the first and second balanced mount electrodes do not overlap the same internal ground electrode; and
when viewing the mount board from the topmost side on which the duplexer is mounted, at least one of the first and second balanced mount electrodes does not oppose the internal ground electrode.

2. The duplexer module according to claim 1, wherein, when viewing the mount board from the topmost side on which the duplexer is mounted, one of the first and second balanced mount electrodes does not oppose the internal ground electrode, and the other one of the second and first balanced mount electrodes opposes the internal ground electrode.

3. The duplexer module according to claim 1, wherein, when viewing the mount board from the topmost side on which the duplexer is mounted, neither of the first balanced mount electrode nor the second balanced mount electrode opposes the internal ground electrode.

4. The duplexer module according to claim 1, wherein the at least one duplexer is one of a surface acoustic wave filter, a boundary acoustic wave filter, or a bulk acoustic wave filter.

5. The duplexer module according to claim 1, wherein the at least one duplexer includes a filter portion having a balanced-unbalanced transforming function.

6. The duplexer module according to claim 1, further comprising a reception filter and a plurality of chip components, wherein the at least one duplexer includes a plurality of duplexers, and the reception filter, the plurality of chip components and the plurality of duplexers are mounted on the front surface of the mount board.

7. The duplexer module according to claim 1, wherein the at least one duplexer is configured such that a transmission frequency band of UMTS-BAND1 is 824 MHz to 849 MHz or 880 MHz to 915 MHz or 1850 MHz to 1910 MHz or 1920 MHz to 1980 MHz, and a reception frequency band thereof is 869 MHz to 894 MHz or 925 MHz to 960 MHz or 1930 MHz to 1990 MHz or 2110 MHz to 2170 MHz.

8. The duplexer module according to claim 1, wherein the at least one duplexer includes a reception filter defined by a longitudinally coupled resonator-type surface acoustic wave filter having a balanced-unbalanced transforming function and a transmission filter defined by a ladder surface acoustic wave filter.

9. The duplexer module according to claim 1, wherein the at least one duplexer includes a wiring board, a reception-side surface acoustic wave filter chip, and a transmission-side surface acoustic wave filter chip, wherein the reception-side surface acoustic wave filter chip and the transmission-side surface acoustic wave filter chip are mounted on the wiring board.

10. The duplexer module according to claim 1, wherein the mount board includes at least four electrode layers and at least three dielectric layers alternately stacked on each other.

11. The duplexer module according to claim 1, wherein the mount board is a printed wiring multilayer board.

12. The duplexer module according to claim 1, wherein the first and second balanced mount electrodes are not substantially electrically coupled to each other.

13. A communication device comprising:
an RF circuit; and
the duplexer module according to claim 1 mounted on the RF circuit.

14. The communication device according to claim 13, wherein the communication device is a cellular phone.

15. A duplexer module comprising:
a mount board that includes a mount electrode layer, an internal electrode layer, a terminal electrode layer, and at least one dielectric layer stacked on each other such that the mount electrode layer is located on a topmost side and the terminal electrode layer is located on a bottommost side and such that the mount electrode layer and the internal electrode layer oppose each other with the at least one dielectric layer therebetween; and
at least one duplexer that is mounted on a front surface of the mount board and that includes first and second balanced terminals; wherein
the mount electrode layer includes a first balanced mount electrode, which is connected to the first balanced terminal, and a second balanced mount electrode, which is connected to the second balanced terminal;
the internal electrode layer includes at least one internal ground electrode; and
when viewing the mount board from the topmost side on which the duplexer is mounted in a stacking direction of the mount electrode layer, the internal electrode layer, the terminal electrode layer, the first and second balanced mount electrodes do not overlap the same internal ground electrode wherein, when viewing the mount board from the topmost side on which the duplexer is mounted, the first balanced mount electrode and the second balanced mount electrode oppose different internal ground electrodes.

16. The duplexer module according to claim 15, wherein the at least one duplexer is one of a surface acoustic wave filter, a boundary acoustic wave filter, or a bulk acoustic wave filter.

17. The duplexer module according to claim 15, wherein the at least one duplexer includes a filter portion having a balanced-unbalanced transforming function.

18. The duplexer module according to claim 15, further comprising a reception filter and a plurality of chip components, wherein the at least one duplexer includes a plurality of duplexers, and the reception filter, the plurality of chip components and the plurality of duplexers are mounted on the front surface of the mount board.

19. The duplexer module according to claim 15, wherein the at least one duplexer is configured such that a transmission frequency band of UMTS-BAND1 is 824 MHz to 849 MHz or 880 MHz to 915 MHz or 1850 MHz to 1910 MHz or 1920 MHz to 1980 MHz, and a reception frequency band thereof is 869 MHz to 894 MHz or 925 MHz to 960 MHz or 1930 MHz to 1990 MHz or 2110 MHz to 2170 MHz.

20. The duplexer module according to claim 15, wherein the at least one duplexer includes a reception filter defined by a longitudinally coupled resonator-type surface acoustic wave filter having a balanced-unbalanced transforming function and a transmission filter defined by a ladder surface acoustic wave filter.

* * * * *